(12) United States Patent
Park

(10) Patent No.: US 8,687,457 B2
(45) Date of Patent: Apr. 1, 2014

(54) SEMICONDUCTOR MEMORY DEVICE AND OPERATING METHOD THEREOF

(75) Inventor: Jung-Hoon Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 260 days.

(21) Appl. No.: 13/334,023

(22) Filed: Dec. 21, 2011

(65) Prior Publication Data

US 2012/0262999 A1 Oct. 18, 2012

(30) Foreign Application Priority Data

Apr. 15, 2011 (KR) ........................ 10-2011-0034945

(51) Int. Cl.
*G11C 8/00* (2006.01)

(52) U.S. Cl.
USPC .............. 365/233.1; 365/233.11; 365/233.12; 365/233.13; 327/144; 327/145; 327/146; 327/163

(58) Field of Classification Search
USPC ............... 365/233.1, 233.11, 233.12, 233.13; 327/141, 144, 145, 146, 163
See application file for complete search history.

(56) References Cited

U.S. PATENT DOCUMENTS

| 7,889,594 | B2 * | 2/2011 | Yoon et al. | 365/233.1 |
| 7,889,595 | B2 * | 2/2011 | Park | 365/233.1 |
| 8,050,136 | B2 * | 11/2011 | Park | 365/233.11 |
| 8,115,524 | B2 * | 2/2012 | Kim et al. | 327/144 |
| 8,125,251 | B2 * | 2/2012 | Park | 327/144 |
| 8,144,542 | B2 * | 3/2012 | Na | 365/233.1 |

* cited by examiner

Primary Examiner — Vanthu Nguyen
(74) Attorney, Agent, or Firm — IP & T Group LLP

(57) ABSTRACT

A semiconductor memory device includes a system clock input block configured to be inputted with a system clock, a data clock input block configured to be inputted with a data clock, a first phase detection block configured to compare a phase of the system clock, generate a first phase detection signal, and determine a logic level of a reverse control signal in response to the first phase detection signal, a second phase detection block configured to compare a phase of a clock acquired by delaying the system clock by a correction time, generate a second phase detection signal, and determine a logic level of a clock select signal in response to the first and second phase detection signals, and a clock select block configured to select and output the data clock or a clock acquired by delaying the data clock.

24 Claims, 4 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2011-0034945, filed on Apr. 15, 2011, which is incorporated herein by reference in its entirety.

BACKGROUND

1. Field

Exemplary embodiments of the present invention relate to semiconductor design technology, and more particularly, to a clock alignment training operation in a semiconductor device.

2. Description of the Related Art

In a system including a plurality of semiconductor devices, the semiconductor devices may store data. If data is requested or provided from a data processing device, for example, a memory control unit (MCU), a semiconductor device outputs data corresponding to an address inputted from the device requesting the data or stores data provided from the data requesting device to a semiconductor device corresponding to the address.

To this end, a semiconductor device, which operates at a high speed, is designed such that two pieces of data are inputted/outputted between a rising edge and a falling edge of a system clock applied from a circuit outside of the semiconductor device and two pieces of data are inputted/outputted between the falling edge and the next rising edge. More specifically, the semiconductor device is designed to input/output four pieces of data during one cycle of the system clock.

However, since the system clock can represent only two states, more specifically, a logic high state and a logic low state, to input/output four pieces of data during one cycle, a data clock with a frequency two times higher than the system clock is included. In other words, a clock dedicated for input/output of data is included.

Therefore, the semiconductor device operating at a high speed uses the system clock as a reference clock when transmitting and receiving an address and a command, and uses the data clock as a reference clock when inputting/outputting data. The data clock may be controlled to have a frequency two times higher than the system clock.

Namely, two cycles of the data clock are repeated during one cycle of the system clock, and input/output of data is respectively implemented at the rising edge and the falling edge of the data clock, such that four pieces of data can be inputted/outputted during one cycle of the system clock.

In this way, unlike a conventional DDR synchronous semiconductor device that uses one system clock as a reference to perform a read or write operation, the semiconductor device operating at a high speed transmits and receives data using two clocks with different frequencies to perform a read or write operation.

In this regard, if the phases of the system clock and the data clock are not aligned with each other, a reference for transmitting an operation command and an address and a reference for transmitting data are not aligned with each other. This misalignment results in the semiconductor device operating at a high speed, but the semiconductor device cannot operate normally.

Due to this fact, in order for the semiconductor device operating at a high speed to normally operate, an interface training operation should be performed between the semiconductor device and the data processing device at an initial operating stage.

Interface training means that interfaces for transmitting a command, an address, and data are trained to operate at optimized times before normal operations are performed between the semiconductor device and the data processing device.

Such interface training is divided into address training, clock alignment training (WCK2CK training), read training, and write training. In the clock alignment training (WCK2CK training), an operation for aligning a data clock and a system clock is performed.

The clock alignment training operation is generally divided into a normal training mode (full training) operation and an auto-synchronous mode operation.

The normal training mode indicates a method used for precisely synchronizing a phase difference between a data clock and a system clock in a semiconductor memory device that operates at a high speed. In the normal training mode, the phases of the data clock and the system clock are compared for a preset period, and a semiconductor memory system synchronizes the phases of the system clock and the data clock through an operation of precisely changing the phase of the data clock according to a comparison result.

The auto-synchronous mode indicates a method used to control a phase difference between a data clock and a system clock so that the phase difference falls within a predetermined range in a semiconductor memory device that operates at a middle speed or a low speed. In the auto-synchronous mode, the phases of the data clock and the system clock are compared, and whether to reverse the phase of the data clock is determined according to a comparison result.

When a semiconductor memory device operates at a high speed, a method of precisely synchronizing the phases of a data clock and a system clock through the normal training mode is useful due to the operation characteristic.

When the semiconductor memory device operates at a middle speed or a low speed, the clock alignment training operation is not always performed through the auto-synchronous mode. Rather, first, the data clock and the system clock are precisely synchronized through the normal training mode, and then, when the phases of the data clock and the system clock are distorted due to a subsequent operation of the semiconductor memory device, the phase of the data clock and the phase of the system clock are recovered through the auto-synchronous mode.

In the operation for recovering the distorted phases of the data clock and the system clock through the auto-synchronous mode, issues may occur as described below.

FIG. 1 is a timing diagram explaining problems caused when performing a clock alignment training operation under an auto-synchronous mode according to the conventional art.

Referring to FIG. 1, an auto-synchronous mode operation for detecting the phases of system clocks HCK and iHCK based on the phases of data clocks WCK and iWCK is shown.

As shown in FIG. 1, jitters may occur in the system clocks HCK and iHCK. As a consequence, in one example, the data clocks WCK and iWCK are matched to logic high levels at the edges of the system clocks HCK and iHCK and in another example, the data clocks WCK and iWCK are mismatched to logic low levels at the edges of the system clocks HCK and iHCK.

When jitters do not occur in the system clocks HCK and iHCK, the data clocks WCK and iWCK are to be detected in the state in which they are mismatched to the logic low levels at the edges of the system clocks HCK and iHCK, and the phases of the data clocks WCK and iWCK are to be reversed.

However, when jitters occur in the system clocks HCK and iHCK, the phases of the data clocks WCK and iWCK may not reversed. Accordingly, the phase differences between the system clocks HCK and iHCK and the data clocks WCK and iWCK become opposite to each other.

While FIG. 1 shows that jitters occur in the system clocks HCK and iHCK, phase mismatch may be caused when jitters occur in the data clocks WCK and iWCK.

If the auto-synchronous mode is not normally operated as described above, the phase differences between the system clocks HCK and iHCK and the data clocks WCK and iWCK are not slight but are substantially opposite to each other. Therefore, when subsequently performing domain crossing by using such system clocks HCK and iHCK and such data clocks WCK and iWCK, data may not normally be inputted/outputted.

SUMMARY

An embodiment of the present invention is directed to a semiconductor memory device that can precisely perform phase comparison between a system clock and a data clock regardless of the occurrence of a jitter in a clock alignment training operation under an auto-synchronous mode.

In accordance with an embodiment of the present invention, a semiconductor memory device includes: a system clock input block configured to be inputted with a system clock; a data clock input block configured to be inputted with a data clock and determine whether to reverse the phase of the data clock in response to a reverse control signal; a first phase detection block configured to compare a phase of the system clock and the phase of the data clock, generate a first phase detection signal, and determine a logic level of the reverse control signal in response to the first phase detection signal; a second phase detection block configured to compare a phase of a clock acquired by delaying the system clock by a self correction time and the phase of the data clock, generate a second phase detection signal, and determine a logic level of a clock select signal in response to the first phase detection signal and the second phase detection signal; and a clock select block configured to select and output any one of the data clock and a clock acquired by delaying the data clock by the self correction time in response to the clock select signal.

In accordance with another embodiment of the present invention, a method for operating a semiconductor memory device includes: receiving a system clock; receiving a data clock and determining whether to reverse the phase of the data clock in response to a reverse control signal; comparing a phase of the system clock and the phase of the data clock and generating a first phase detection signal; detecting a phase of a clock acquired by delaying the system clock by a self correction time and generating a second phase detection signal; selecting any one of the data clock and a clock acquired by delaying the data clock by the self correction time in response to the first and second phase detection signals; and determining a logic level of the reverse control signal in response to the first phase detection signal after the selecting any one of the data clock and a clock acquired by delaying the data clock by the self correction time is implemented.

DETAILED DESCRIPTION

Figure 1:
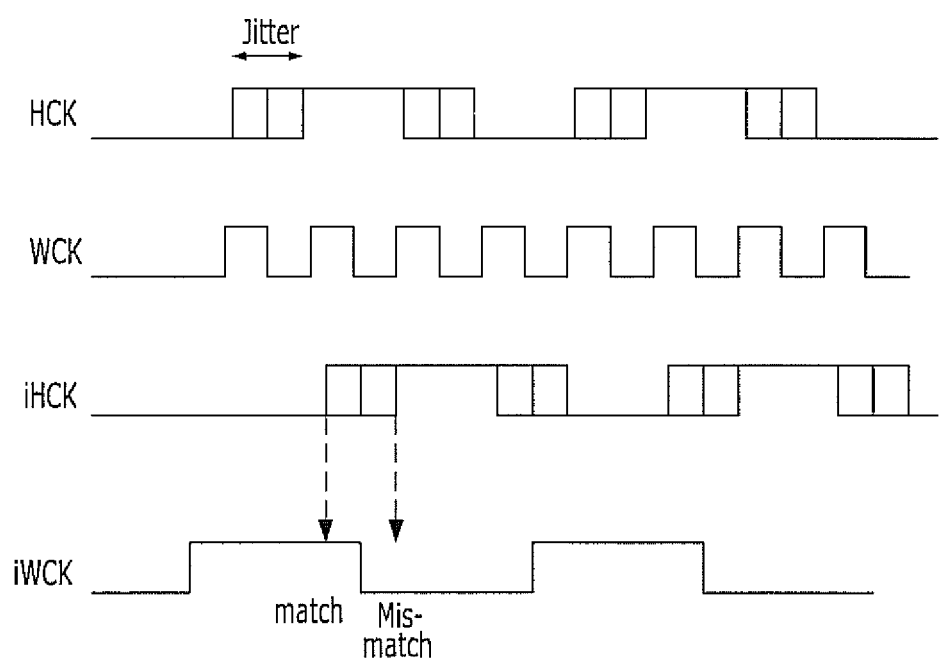
FIG. 1 is a timing diagram illustrating issues caused when performing a clock alignment training operation under an auto-synchronous mode according to the conventional art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
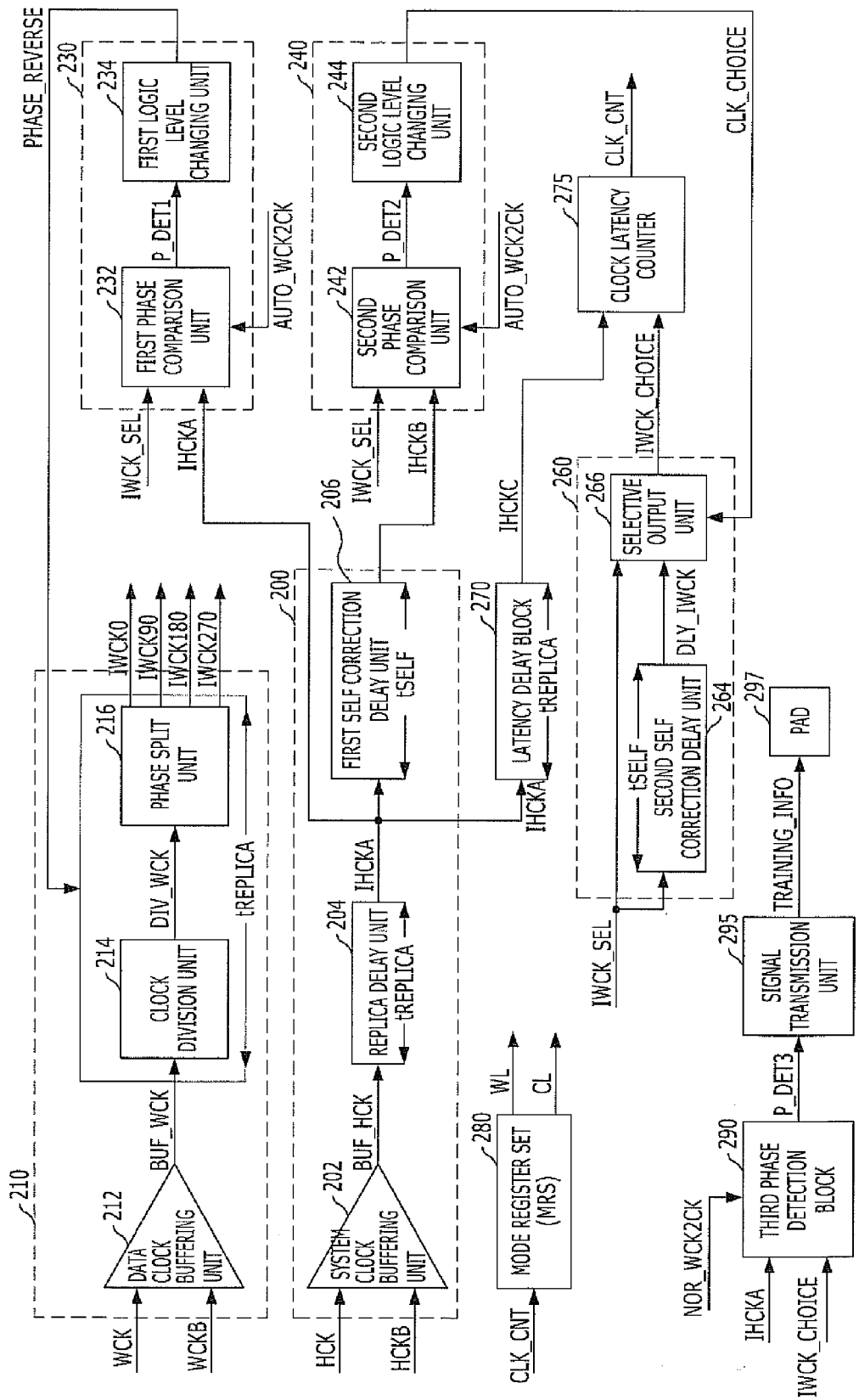
FIG. 2 is a block diagram illustrating a semiconductor memory device in accordance with an embodiment of the present invention, which performs a clock alignment training operation under an auto-synchronous mode.

FIG. 2 is a block diagram illustrating a semiconductor memory device in accordance with an embodiment of the present invention, which performs a clock alignment training operation under an auto-synchronous mode.

Referring to FIG. 2, the semiconductor memory device includes a system clock input block 200 configured to be inputted with system clocks HCK and HCKB as an inputted system clock IHCKA; a data clock input block 210 configured to be inputted with data clocks WCK and WCKB as an inputted data clock IWCK_SEL and determine whether to reverse the phase of the data clock in response to a reverse control signal PHASE_REVERSE; a first phase detection block 230 configured to detect the phase of the inputted system clock IHCKA based on the phase of the inputted data clock IWCK_SEL, generate a first phase detection signal P_DET1, and determine the logic level of the reverse control signal PHASE_REVERSE in response to the first phase detection signal P_DET1; a second phase detection block 240 configured to detect the phase of a clock IHCKB acquired by delaying the inputted system clock IHCKA by a self correction time tSELF based on the phase of the inputted data clock IWCK_SEL, generate a second phase detection signal P_DET2, and determine the logic level of a clock select signal CLK_CHOICE in response to the first phase detection signal P_DET1 and the second phase detection signal P_DET2; and a clock select block 260 configured to select and output any one of the inputted data clock IWCK_SEL and a clock DLY_IWCK acquired by delaying the inputted data clock IWCK_SEL by the self correction time tSELF, as a clock IWCK_CHOICE in response to the clock select signal CLK_CHOICE.

Further, the semiconductor memory device includes a third phase detection block 290 configured to detect the phase of the inputted system clock IHCKA based on the phase of the clock IWCK_CHOICE outputted from the clock select block 260 and generate a training information signal TRAINING_INFO in correspondence to a third phase detection signal P_DET3; and a signal transmission unit 295 configured to transmit the training information signal TRAINING_INFO to a circuit outside of the semiconductor memory device through a preset pad 297.

Also, the semiconductor memory device includes a latency delay block 270 configured to output the inputted system clock IHCKA by delaying the inputted system clock IHCKA by a time corresponding to an operation delay amount tREPLICA of the data clock input block 210; a clock latency counter 275 configured to count the phase difference between a clock IHCKC outputted from the latency delay block 270 and the clock IWCK_CHOICE outputted from the clock select block 260 by the period of the clock IWCK_CHOICE outputted from the clock select block 260; and a mode register set (MRS) 280 configured to set the value of a write latency WL and the value of a column latency CL in response to an output signal CLK_CNT of the clock latency counter 275.

The data clocks WCK and WCKB inputted from a circuit outside of the semiconductor memory device have frequencies a number of times higher than the system clocks HCK and HCKB. For example, the data clocks WCK and WCKB have frequencies two times higher than the system clocks HCK and HCKB.

The data clock input block 210 may be configured in two ways depending upon the reverse control signal PHASE_REVERSE that is used.

First, the data clock input block 210 includes a data clock buffering unit 212 configured to be inputted with and buffer the data clocks WCK and WCKB to synchronize the input timings of data signals; a clock division unit 214 configured to divide a clock BUF_WCK outputted from the data clock buffering unit 212, generate a data-dividing clock DIV_WCK with the same frequency as the system clocks HCK and HCKB, and determine whether to reverse the phase of the data-dividing clock DIV_WCK in response to the reverse control signal PHASE_REVERSE; and a phase split unit 216 configured to generate a plurality of multi-phase data-dividing clocks IWCK0, IWCK90, IWCK180 and IWCK270 with a designated phase difference in response to the data-dividing clock DIV_WCK. More specifically, in this configuration, whether to reverse the phase of the data-dividing clock DIV_WCK is determined as the reverse control signal PHASE_REVERSE is applied to the clock division unit 214.

Second, the data clock input block 210 includes a data clock buffering unit 212 configured to be inputted with and buffer the data clocks WCK and WCKB to synchronize the input timings of data signals; a clock division unit 214 configured to divide a clock BUF_WCK outputted from the data clock buffering unit 212, and generate a data-dividing clock DIV_WCK with the same frequency as the system clocks HCK and HCKB; and a phase split unit 216 configured to generate a plurality of multi-phase data-dividing clocks IWCK0, IWCK90, IWCK180 and IWCK270 with a designated phase difference in response to the data-dividing clock DIV_WCK, and the phase split unit 216 is also configured to determine whether to reverse the phases of the plurality of multi-phase data-dividing clocks IWCK0, IWCK90, IWCK180 and IWCK270 in response to the reverse control signal PHASE_REVERSE. More specifically, in this configuration, whether to reverse the phases of the plurality of multi-phase data-dividing clocks IWCK0, IWCK90, IWCK180 and IWCK270 is determined as the reverse control signal PHASE_REVERSE is applied to the phase split unit 216.

The two configurations of the data clock input block 210 described above have no substantial difference in terms of operation, except that the reverse control signal PHASE_REVERSE is applied to the clock division unit 214 or the phase split unit 216. Therefore, the two configurations may be selected by a designer without limitation.

The system clock input block 200 includes a system clock buffering unit 202 configured to be inputted with and buffer the system clocks HCK and HCKB to synchronize the input timings of address signals and command signals; a replica delay unit 204 configured to delay a clock BUF_HCK outputted from the system clock buffering unit 202 by a preset delay amount tREPLICA and output a first system clock IHCKA; and a first self correction delay unit 206 configured to delay the first system clock IHCKA by the self correction time tSELF, and generate a second system clock IHCKB. The preset delay amount tREPLICA has a value corresponding to the operation delay amount of the clock division unit 214 and the phase split unit 216 of the data clock input block 210. More specifically, the operation of delaying the system clocks HCK and HCKB through the first replica delay unit 204 delays the system clocks HCK and HCKB by the amount of time that the data clocks WCK and WCKB are delayed through the clock division unit 214 and the phase split unit 216.

The delay amount corresponding to the self correction time tSELF of the first self correction delay unit 206 is not a fixed value. More specifically, the value of the delay amount may be changed without limitation by the designer. For example, the value of the delay amount corresponding to the self correction time tSELF may be changed depending upon the operating speed of the semiconductor memory device.

The first phase detection block 230 includes a first phase comparison unit 232 configured to compare the phase of a select clock IWCK_SEL, which is selected among the plurality of multi-phase data-dividing clocks IWCK0, IWCK90, IWCK180 and IWCK270, and the phase of the first system clock IHCKA after an auto-training control signal AUTO_WCK2CK is activated and an auto-training mode is entered. The first phase comparison unit 232 is also configured to generate the first phase detection signal P_DET1. The first phase detection block 230 also includes a first logic level changing unit 234 configured to be repeatedly inputted with the first phase detection signal P_DET1 a first number of times after the auto-training mode is entered and determine the logic level of the reverse control signal PHASE_REVERSE in response to a result of the determination.

When the first phase detection signal P_DET1 maintains the same logic level for a first amount of time (corresponding to a time that the cycle of the select clock IWCK_SEL is repeated a first number of times), the first logic level changing unit 234 determines the logic level of the reverse control signal PHASE_REVERSE according to a behavior of the first phase detection signal P_DET1.

For example, when the select clock IWCK_SEL, which is first applied at the edge of the first system clock IHCKA first applied after the auto-training control signal AUTO_WCK2CK is activated and the auto-training mode is entered, is activated and thus the logic level of the first phase detection signal P_DET1 is changed to a logic high level, the logic level of the reverse control signal PHASE_REVERSE is not immediately determined as a logic low level. Instead, when the select clock IWCK_SEL continuously maintains an activated state at the edges of the first system clock IHCKA for three times (for example, the first number of times is 3) after the auto-training mode is entered, which means the logic level of the first phase detection signal P_DET1 maintains a logic high level continuously for three times, the logic level of the reverse control signal PHASE_REVERSE is determined as a logic low level When the reverse control signal PHASE_REVERSE is determined as a logic low level, the phases of the data clocks WCK and WCKB are not reversed by the data clock input block 210.

Conversely, when the select clock IWCK_SEL, which is first applied at the edge of the first system clock IHCKA first applied after the auto-training control signal AUTO_WCK2CK is activated and the auto-training mode is entered, is deactivated and thus the logic level of the first phase detection signal P_DET1 is changed to a logic low level, the logic level of the reverse control signal PHASE_R-

EVERSE is not immediately determined as a logic high level. Instead, when the select clock IWCK_SEL continuously maintains a deactivated state at the edges of the first system clock IHCKA for three times (for example, the first number of times is 3) after the auto-training mode is entered, which means the logic level of the first phase detection signal P_DET1 maintains a logic low level continuously for three times, the logic level of the reverse control signal PHASE_REVERSE is determined as a logic high level. When the reverse control signal PHASE_REVERSE is determined as a logic low level, the phases of the data clocks WCK and WCKB are reversed by the data clock input block 210.

The second phase detection block 240 includes a second phase comparison unit 242 configured to compare the phase of the select clock IWCK_SEL, which is selected among the plurality of multi-phase data-dividing clocks IWCK0, IWCK90, IWCK180 and IWCK270, and the phase of the second system clock IHCKB after the auto-training control signal AUTO_WCK2CK is activated and the auto-training mode is entered. The second phase comparison block 242 is also configured to generate the second phase detection signal P_DET2. The second phase detection block 240 also includes a second logic level changing unit 244 configured to be repeatedly inputted with the first phase detection signal P_DET1 and the second phase detection signal P_DET2 a second number of times (less than the first number of times) after the auto-training mode is entered and determine the logic level of the clock select signal CLK_CHOICE in response to a result of the determination.

When the first phase detection signal P_DET1 and the second phase detection signal P_DET2 have the same logic level or have different logic levels is maintained for a second time (corresponding to a time that the cycle of the select clock IWCK_SEL is repeated a second number of times), the second logic level changing unit 244 determines the logic level of the clock select signal CLK_CHOICE according to the behavior of the first and second phase detection signals P_DET1 and P_DET2.

For example, when the first phase detection signal P_DET1 and the second phase detection signal P_DET2 have the same logic level during the cycle of the select clock IWCK_SEL, which is first applied after the auto-training control signal AUTO_WCK2CK is activated and the auto-training mode is entered, the logic level of the clock select signal CLK_CHOICE is not immediately determined as a logic high level. Instead, when the first phase detection signal P_DET1 and the second phase detection signal P_DET2 continuously have the same logic level during two cycles of the select clock IWCK_SEL (for example, the second number of times is 2) after the auto-training mode is entered, the logic level of the clock select signal CLK_CHOICE is determined as a logic high level.

Conversely, when the first phase detection signal P_DET1 and the second phase detection signal P_DET2 have opposite logic levels during the cycle of the select clock IWCK_SEL, which is first applied after the auto-training control signal AUTO_WCK2CK is activated and the auto-training mode is entered, the logic level of the clock select signal CLK_CHOICE is not immediately determined as a logic low level. Instead, when the first phase detection signal P_DET1 and the second phase detection signal P_DET2 continuously have opposite logic levels during two cycles of the select clock IWCK_SEL (for example, the second number of times is 2) after the auto-training mode is entered, the logic level of the clock select signal CLK_CHOICE is determined as a logic low level.

The select clock IWCK_SEL, which is used in both of the first phase detection block 230 and the second phase detection block 240, may be the multi-phase data-dividing clocks IWCK90 and IWCK270 including phases that are not the same as and are not opposite to the data-dividing clock DIV_WCK, among the plurality of multi-phase data-dividing clocks IWCK0, IWCK90, IWCK180 and IWCK270. If there are several multi-phase data-dividing clocks IWCK90 and IWCK270 including phases that are not the same as and are not opposite to the data-dividing clock DIV_WCK, among the plurality of multi-phase data-dividing clocks IWCK0, IWCK90, IWCK180 and IWCK270, which clock is to be outputted as the select clock IWCK_SEL may be determined in advance by the designer.

The first phase detection block 230 and the second phase detection block 240 are controlled such that their operations are started after the auto-training control signal AUTO_WCK2CK is activated and the auto-training mode is entered. In particular, while the first phase detection block 230 and the second phase detection block 240 simultaneously start to operate after the auto-training mode is entered, the logic level of the clock select signal CLK_CHOICE is determined first by the operation of the second phase detection block 240 and subsequently the logic level of the reverse control signal PHASE_REVERSE is determined by the operation of the first phase detection block 230.

The reason that the operation ending times of the first phase detection block 230 and the second phase detection block 240 are not the same is because, if the logic level of the reverse control signal PHASE_REVERSE is determined by the operation of the first phase detection block 230 earlier than the logic level of the clock select signal CLK_CHOICE outputted by the operation of the second phase detection block 240, the logic level of the clock select signal CLK_CHOICE outputted by the operation of the second phase detection block 240 may vary. More specifically, where the phase of the select clock IWCK_SEL is not reversed by the reverse control signal PHASE_REVERSE outputted by the operation of the first phase detection block 230, no influence is exerted on the operation of the second phase detection block 240. However, where the phase of the select clock IWCK_SEL is reversed by the reverse control signal PHASE_REVERSE outputted by the operation of the first phase detection block 230, the phase of the select clock IWCK_SEL inputted to the second phase detection block 240 is reversed. As a result, the output of the second phase detection block 240 may vary. Therefore, the operation of the second phase detection block 240 is to end before the operation of the first phase detection block 230.

The clock select block 260 includes a second self correction delay unit 264 configured to delay the select clock IWCK_SEL by the self correction time tSELF and output a delayed select clock DLY_IWCK; and a selective output unit 266 configured to select and output any one of the select clock IWCK_SEL and the delayed select clock DLY_IWCK in response to the clock select signal CLK_CHOICE. If the clock select signal CLK_CHOICE is outputted at a logic high level, the clock select block 266 selects the select clock IWCK_SEL. If the clock select signal CLK_CHOICE is outputted at a logic low level, the clock select block 266 selects the clock DLY_IWCK acquired by delaying the select clock IWCK_SEL by the self correction time tSELF.

The delay amount corresponding to the self correction time tSELF of the second self correction delay unit 264 is not a fixed value. More specifically, the value of the delay amount may be changed without limitation by the designer. For example, the value of the delay amount corresponding to the self correction time tSELF may be changed depending upon the operating speed of the semiconductor memory device.

When the operations of the first phase detection block 230 and the second phase detection block 240 are completed, and the logic levels of the reverse control signal PHASE_REVERSE and the clock select signal CLK_CHOICE are determined, the first system clock IHCKA and the clock IWCK_CHOICE outputted from the clock select block 260 have phases synchronized within a preset error range.

Accordingly, a normal training mode to perform an operation for precisely synchronizing the first system clock IHCKA and the clock IWCK_CHOICE outputted from the clock select block 260 may be selectively entered. Component elements, which are used when entering the normal training mode in this way, are the third phase detection block 290 and the signal transmission unit 295. Since the detailed operations of the third phase detection block 290 and the signal transmission unit 295 are well known to a person skilled in the art, further descriptions of the third phase detection block 290 and the signal transmission unit 295 are omitted.

Further, after the auto-training mode is exited, values of the write latency WL and the column latency CL, which are applied to actual data input/output operations, may be set by using the first system clock IHCKA and the clock IWCK_CHOICE outputted from the clock select block 260, which have synchronized phases within the preset error range. Component elements, which are used to set the values of the write latency WL and the column latency CL, which are applied to actual data input/output operations, are the latency delay block 270, the clock latency counter 275, and the mode register set (MRS) 280.

In detail, the latency delay block 270 delays the first system clock IHCKA by the preset delay amount tREPLICA and outputs the clock IHCKC. Since the first system clock IHCKA is nearly synchronized with the clock IWCK_CHOICE outputted from the clock select block 260, the clock IHCKC outputted from the latency delay block 270 has a phase difference corresponding to the preset delay amount tREPLICA from the clock IWCK_CHOICE outputted from the clock select block 260.

The clock latency counter 275 counts the phase difference between the clock IHCKC outputted from the latency delay block 270 and the clock IWCK_CHOICE outputted from the clock select block 260 by the period of the clock IWCK_CHOICE outputted from the clock select block 260.

Because the preset delay amount tREPLICA has the value corresponding to the operation delay amount of the clock division unit 214 and the phase split unit 216 of the data clock input block 210, the clock latency counter 275 counts the number of times that the cycle of the clock IWCK_CHOICE outputted from the clock select block 260 is repeated for the delay time between the data clocks WCK and WCKB and the select clock IWCK_SEL.

The mode register set (MRS) 280 performs an operation of determining the values of the write latency WL and the column latency CL in response to the output signal CLK_CNT of the clock latency counter 275 after the operation of the clock latency counter 275 is ended.

For example, setting values indicating that the write latency WL is set to '3' and the column latency CL is set to '5' when the output signal CLK_CNT of the clock latency counter 275 is '2' are determined in advance by the designer in the mode register set (MRS) 280. Accordingly, if the value of the output signal CLK_CNT of the clock latency counter 275 is determined, the values of the write latency WL and the column latency CL are automatically determined by the setting values determined in advance by the mode register set (MRS) 280.

FIGS. 3A to 3D are timing diagrams illustrating operations of the semiconductor memory device shown in FIG. 2, which performs the clock alignment training operation under the auto-synchronous mode.

The timing diagrams shown in FIGS. 3A to 3D illustrate the respective states of logic levels outputted by the first phase detection signal P_DET1 by the operation of the first phase comparison unit 232 and the second phase detection signal P_DET2 by the operation of the second phase comparison unit 242. According to the respective states, the timing diagrams illustrate how the logic level of the reverse control signal PHASE_REVERSE outputted from the first phase detection block 230 and the logic level of the clock select signal CLK_CHOICE outputted from the second phase detection block 240 are determined.

Figure 3A:
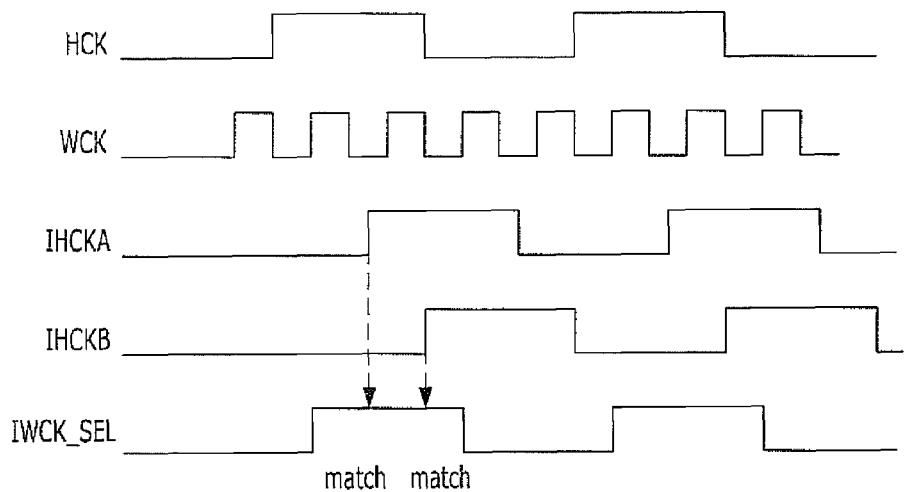
FIGS. 3A to 3D are timing diagrams illustrating operations of the semiconductor memory device shown in FIG. 2, which performs the clock alignment training operation under the auto-synchronous mode.

First, referring to FIG. 3A, since the select clock IWCK_SEL maintains an activated state at the edge of the first system clock IHCKA, the first phase detection signal P_DET1 becomes a matched state. Similarly, since the select clock IWCK_SEL maintains an activated state at the edge of the second system clock IHCKB, the second phase detection signal P_DET2 also becomes a matched state.

In this way, since both the first phase detection signal P_DET1 and the second phase detection signal P_DET2 become the matched states, the rising edge of the first system clock IHCKA and the rising edge of the select clock IWCK_SEL (or the falling edge of the first system clock IHCKA and the falling edge of the select clock IWCK_SEL) are within the preset error range. Accordingly, the clock select signal CLK_CHOICE is activated such that the select clock IWCK_SEL may be outputted from the clock select block 260.

The fact that the first phase detection signal P_DET1 becomes the matched state and the rising edge of the first system clock IHCKA and the rising edge of the select clock IWCK_SEL (or the falling edge of the first system clock IHCKA and the falling edge of the select clock IWCK_SEL) are within the preset error range means that any additional operation for synchronizing the phases of the first system clock IHCKA and the select clock IWCK_SEL is not performed. Therefore, the reverse control signal PHASE_REVERSE is deactivated, and the phase of the select clock IWCK_SEL is not reversed.

Figure 3B:
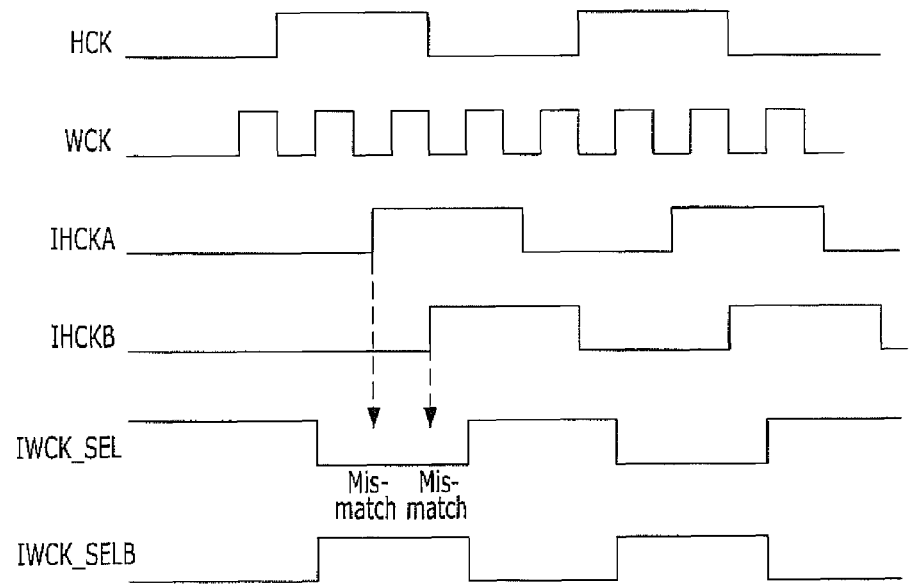

Referring to FIG. 3B, since the select clock IWCK_SEL maintains a deactivated state at the edge of the first system clock IHCKA, the first phase detection signal P_DET1 becomes a mismatched state. Similarly, since the select clock IWCK_SEL maintains a deactivated state at the edge of the second system clock IHCKB, the second phase detection signal P_DET2 also becomes a mismatched state.

In this way, since both the first phase detection signal P_DET1 and the second phase detection signal P_DET2 become the mismatched states, the rising edge of the first system clock IHCKA and the falling edge of the select clock IWCK_SEL (or the falling edge of the first system clock IHCKA and the rising edge of the select clock IWCK_SEL) are within the preset error range. Accordingly, the clock select signal CLK_CHOICE is activated such that the select clock IWCK_SEL may be outputted from the clock select block 260.

The fact that the first phase detection signal P_DET1 becomes the mismatched state and the rising edge of the first system clock IHCKA and the falling edge of the select clock IWCK_SEL (or the falling edge of the first system clock IHCKA and the rising edge of the select clock IWCK_SEL)

are within the preset error range means that the phase of any one of the first system clock IHCKA and the select clock IWCK_SEL should be reversed to synchronize the phases of the first system clock IHCKA and the select clock IWCK_SEL. Therefore, the reverse control signal PHASE_REVERSE is activated such that the phase of the select clock IWCK_SEL is reversed.

As a consequence, the select clock IWCK_SEL, which is reversed in the phase by the reverse control signal PHASE_REVERSE, is synchronized with the first system clock IHCKA within the preset error range.

Figure 3C:
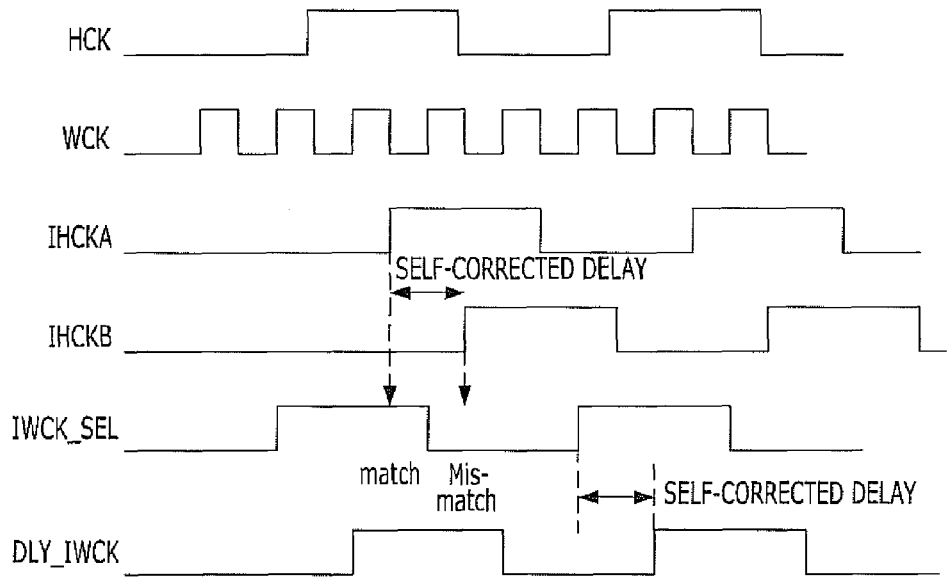

Referring to FIG. 3C, since the select clock IWCK_SEL maintains an activated state at the edge of the first system clock IHCKA, the first phase detection signal P_DET1 becomes a matched state. However, since the select clock IWCK_SEL maintains a deactivated state at the edge of the second system clock IHCKB, the second phase detection signal P_DET2 becomes a mismatched state.

In this way, since the first phase detection signal P_DET1 becomes the matched state and the second phase detection signal P_DET2 becomes the mismatched state, the rising edge of the first system clock IHCKA and the rising edge of the select clock IWCK_SEL (or the falling edge of the first system clock IHCKA and the falling edge of the select clock IWCK_SEL) are not within the preset error range. Accordingly, the clock select signal CLK_CHOICE is deactivated such that the clock DLY_IWCK acquired by delaying the select clock IWCK_SEL by the self correction time tSELF may be outputted from the clock select block 260. As a consequence, the rising edge of the clock DLY_IWCK acquired by delaying the select clock IWCK_SEL by the self correction time tSELF, which is outputted from the clock select block 260, and the rising edge of the first system clock IHCKA (or the falling edge of the clock DLY_IWCK acquired by delaying the select clock IWCK_SEL by the self correction time tSELF and the falling edge of the first system clock IHCKA) are within the preset error range.

Also, the fact that the first phase detection signal P_DET1 becomes the matched state and the rising edge of the first system clock IHCKA and the rising edge of the clock DLY_IWCK acquired by delaying the select clock IWCK_SEL by the self correction time tSELF (or the falling edge of the first system clock IHCKA and the falling edge of the clock DLY_IWCK acquired by delaying the select clock IWCK_SEL by the self correction time tSELF) are within the preset error range means that any additional operation for synchronizing the phases of the first system clock IHCKA and the clock DLY_IWCK acquired by delaying the select clock IWCK_SEL by the self correction time tSELF is not performed. Therefore, the reverse control signal PHASE_REVERSE is deactivated, and the phase of the predetermined select clock IWCK_SEL is not reversed. Thus, the phase of the clock DLY_IWCK acquired by delaying the select clock IWCK_SEL by the self correction time tSELF is not reversed.

Figure 3D:
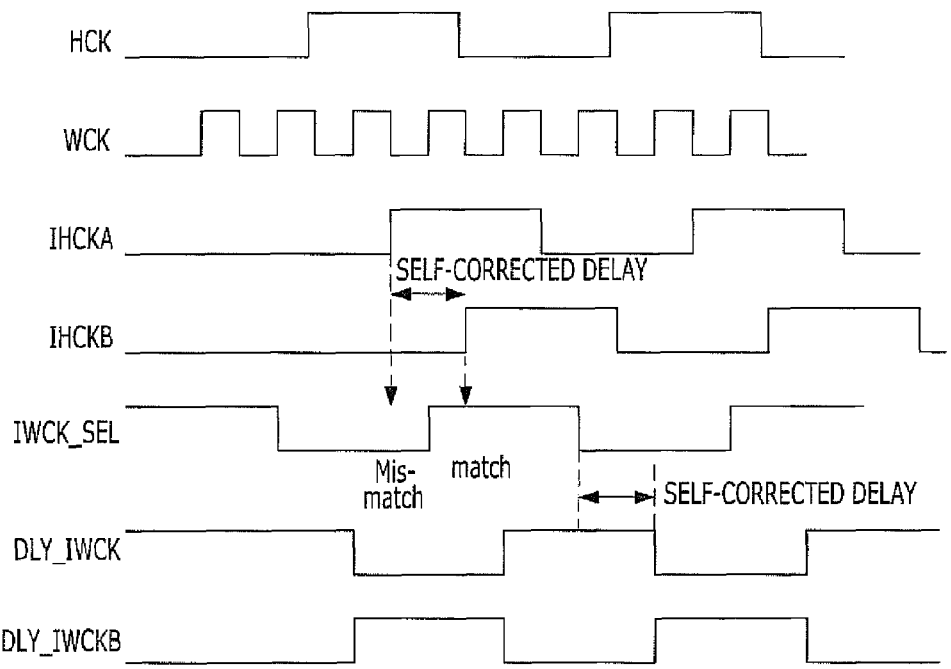

Referring to FIG. 3D, since the select clock IWCK_SEL maintains a deactivated state at the edge of the first system clock IHCKA, the first phase detection signal P_DET1 becomes a mismatched state. However, since the select clock IWCK_SEL maintains an activated state at the edge of the second system clock IHCKB, the second phase detection signal P_DET2 becomes a matched state.

In this way, since the first phase detection signal P_DET1 becomes the mismatched state and the second phase detection signal P_DET2 becomes the matched state, the rising edge of the first system clock IHCKA and the falling edge of the select clock IWCK_SEL (or the falling edge of the first system clock IHCKA and the rising edge of the select clock IWCK_SEL) are not within the preset error range. Accordingly, the clock select signal CLK_CHOICE is deactivated such that the clock DLY_IWCK acquired by delaying the select clock IWCK_SEL by the self correction time tSELF may be outputted from the clock select block 260. As a consequence, the rising edge of the clock DLY_IWCK acquired by delaying the select clock IWCK_SEL by the self correction time tSELF, which is outputted from the clock select block 260, and the falling edge of the first system clock IHCKA (or the falling edge of the clock DLY_IWCK acquired by delaying the select clock IWCK_SEL by the self correction time tSELF and the rising edge of the first system clock IHCKA) are within the preset error range.

Also, the fact that the first phase detection signal P_DET1 becomes the mismatched state and the rising edge of the first system clock IHCKA and the falling edge of the clock DLY_IWCK acquired by delaying the select clock IWCK_SEL by the self correction time tSELF (or the falling edge of the first system clock IHCKA and the rising edge of the clock DLY_IWCK acquired by delaying the select clock IWCK_SEL by the self correction time tSELF) are within the preset error range means that the phase of any one of the first system clock IHCKA and the clock DLY_IWCK acquired by delaying the select clock IWCK_SEL by the self correction time tSELF should be reversed to synchronize the phases of the first system clock IHCKA and the clock DLY_IWCK acquired by delaying the select clock IWCK_SEL by the self correction time tSELF. Therefore, the reverse control signal PHASE_REVERSE is activated, and the phase of the clock DLY_IWCK acquired by delaying the select clock IWCK_SEL by the self correction time tSELF is reversed.

As a consequence, the clock DLY_IWCK acquired by delaying the select clock IWCK_SEL by the self correction time tSELF, which is reversed in the phase by the reverse control signal PHASE_REVERSE, is synchronized with the first system clock IHCKA within the preset error range.

As described above, according to the embodiments of the present invention, a system clock and a data clock (more specifically, the first system clock IHCKA and the predetermined select clock IWCK_SEL) may be compared with a self correction time interval (tSELF) when performing a clock alignment training operation under an auto-synchronous mode, so that to the system may determine whether a jitter occurs in a system clock or a data clock. If it is determined, as a result of the comparison, that a jitter occurs, the phase of any one of the two clocks may be corrected so that the two clocks may be synchronized within a preset error range.

Due to this fact, even though a jitter occurs in the system clock or the data clock, the occurrence of a clock domain crossing fail may be prevented when performing a data write operation or a data read operation using the clocks.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory device comprising:
a system clock input block configured to be inputted with a system clock;
a data clock input block configured to be inputted with a data clock and determine whether to reverse the phase of the data clock in response to a reverse control signal;
a first phase detection block configured to compare a phase of the system clock and the phase of the data clock, generate a first phase detection signal, and determine a logic level of the reverse control signal in response to the first phase detection signal;

a second phase detection block configured to compare a phase of a clock acquired by delaying the system clock by a self correction time and the phase of the data clock, generate a second phase detection signal, and determine a logic level of a clock select signal in response to the first phase detection signal and the second phase detection signal; and a clock select block configured to select and output any one of the data clock and a clock acquired by delaying the data clock by the self correction time in response to the clock select signal.

2. The semiconductor memory device of claim 1, further comprising:

a third phase detection block configured to compare the phase of the system clock and a phase of a clock outputted from the clock select block and generate a training information signal in correspondence to a detection result; and a signal transmission unit configured to transmit the training information signal to a circuit outside of the semiconductor memory device.

3. The semiconductor memory device of claim 1, further comprising:

a latency delay block configured to output the system clock after delaying the system clock by a delay amount corresponding to an operation delay amount of the data clock input block;

a clock latency counter configured to count a phase difference between a clock outputted from the latency delay block and the clock outputted from the clock select block by the period of the clock outputted from the clock select block; and a mode register set configured to set a value of a write latency and a value of a column latency in response to an output signal of the clock latency counter.

4. The semiconductor memory device of claim 1, wherein the data clock has a frequency a number of times higher than the system clock.

5. The semiconductor memory device of claim 4, wherein the data clock input block comprises:

a data clock buffering unit configured to be inputted with and buffer the data clock to synchronize input timings of data signals;

a clock division unit configured to divide a clock outputted from the data clock buffering unit, generate a data-dividing clock with the same frequency as the system clock, and determine whether to reverse a phase of the data-dividing clock in response to the reverse control signal; and a phase split unit configured to generate a plurality of multi-phase data-dividing clocks with phase differences in response to the data-dividing clock.

6. The semiconductor memory device of claim 4, wherein the data clock input block comprises:

a data clock buffering unit configured to be inputted with and buffer the data clock to synchronize input timings of data signals;

a clock division unit configured to divide a clock outputted from the data clock buffering unit and generate a data-dividing clock with the same frequency as the system clock; and a phase split unit configured to generate a plurality of multi-phase data-dividing clocks with phase differences in response to the data-dividing clock and determine whether to reverse phases of the plurality of multi-phase data-dividing clocks in response to the reverse control signal.

7. The semiconductor memory device of claim 5, wherein the system clock input block comprises:

a system clock buffering unit configured to be inputted with and buffer the system clock to synchronize input timings of address signals and command signals;

a replica delay unit configured to delay a clock outputted from the system clock buffering unit by a delay amount corresponding to an operation delay amount of the clock division unit and the phase split unit and output a first system clock; and a first self correction delay unit configured to delay the first system clock by the self correction time and generate a second system clock.

8. The semiconductor memory device of claim 7, wherein the first phase detection block comprises:

a first phase comparison unit configured to compare a phase of a select clock, selected among the plurality of multi-phase data-dividing clocks, and a phase of the first system clock after an auto-training mode is entered and generate the first phase detection signal; and a first logic level changing unit configured to be repeatedly inputted with the first phase detection signal a first number of times after the auto-training mode is entered and determine the logic level of the reverse control signal when the first detection signal maintains the same logic level for a first time corresponding to a time that a cycle of the select clock is repeated a first number of times.

9. The semiconductor memory device of claim 8, wherein the second phase detection block comprises:

a second phase comparison unit configured to compare the phase of the select clock and a phase of the second system clock after the auto-training mode is entered and generate the second phase detection signal; and a second logic level changing unit configured to be repeatedly inputted with the first phase detection signal and the second phase detection signal a second number of times after the auto-training mode is entered and determine the logic level of the clock select signal when the first detection signal and the second detection signal maintain the same logic level for a second time corresponding to a time that the cycle of the select clock is repeated a second number of times, wherein the second number of times is less than the first number of times.

10. The semiconductor memory device of claim 9, wherein, when the first phase detection signal maintains the same logic level for a first time corresponding to a time that a cycle of the select clock is repeated a first number of times, the first logic level changing unit changes the logic level of the reverse control signal in correspondence to that.

11. The semiconductor memory device of claim 10, wherein, when a state in which the first phase detection signal and the second phase detection signal have the same logic level or have different logic levels is maintained for a second time corresponding to a time that the cycle of the select clock is repeated a second number of times, the second logic level changing unit determines the logic level of the clock select signal in correspondence to that.

12. The semiconductor memory device of claim 11, wherein the clock select block comprises:

a second self correction delay unit configured to delay the select clock by the self correction time and output a delayed select clock; and a selective output unit configured to select and output any one of the select clock and the delayed select clock in response to the clock select signal.

13. The semiconductor memory device of claim 12, wherein the select clock is a multi-phase data-dividing clock including a phase that is not the same as and is not opposite to the data-dividing clock, among the plurality of multi-phase data-dividing clocks.

14. A method for operating a semiconductor memory device, comprising:
receiving a system clock;
receiving a data clock and determining whether to reverse the phase of the data clock in response to a reverse control signal;
comparing a phase of the system clock and the phase of the data clock and generating a first phase detection signal;
detecting a phase of a clock acquired by delaying the system clock by a self correction time and generating a second phase detection signal;
selecting any one of the data clock and a clock acquired by delaying the data clock by the self correction time in response to the first and second phase detection signals; and
determining a logic level of the reverse control signal in response to the first phase detection signal after the selecting any one of the data clock and a clock acquired by delaying the data clock by the self correction time is implemented.

15. The method of claim 14, wherein, after the determining of the logic level is implemented, the method further comprises:
comparing the phase of the system clock and a phase of a clock selected through the selecting of any one of the data clock and a clock acquired by delaying the data clock by the self correction time and generating a training information signal in correspondence to a detection result; and
transmitting the training information signal to a circuit outside of the semiconductor memory device.

16. The method of claim 14, wherein the data clock has a frequency a number of times higher than the system clock.

17. The method of claim 16, wherein the receiving of the data clock comprises:
receiving from the circuit outside of the semiconductor memory device and buffering the data clock for synchronizing input timings of data signals;
dividing a phase of a clock outputted as a result of the buffering of the data clock, generating a data-dividing clock with the same frequency as the system clock, and determining whether to reverse a phase of the data-dividing clock in response to the reverse control signal; and
generating a plurality of multi-phase data-dividing clocks with phase differences in response to the data-dividing clock.

18. The method of claim 16, wherein the receiving of the data clock comprises:
receiving from the circuit outside of the semiconductor memory device and buffering the data clock for synchronizing input timings of data signals;
dividing a phase of a clock outputted as a result of the buffering of the data clock, and generating a data-dividing clock with the same frequency as the system clock; and
generating a plurality of multi-phase data-dividing clocks with phase differences in response to the data-dividing clock and determining whether to reverse phases of the plurality of multi-phase data-dividing clocks in response to the reverse control signal.

19. The method of claim 17, wherein the receiving of the system clock comprises:
receiving, from the circuit outside of the semiconductor memory device, and buffering the system clock for synchronizing input timings of address signals and command signals;
delaying a clock outputted as a result of the buffering of the system clock by a delay amount corresponding to an operation delay amount of the generating of the data-dividing clock and the generating of the plurality of multi-phase data-dividing clocks, and outputting a first system clock; and
delaying the first system clock by the self correction time and generating a second system clock.

20. The method of claim 19, wherein the generating of the first and second phase detection signals comprises:
comparing a phase of a select clock selected among the plurality of multi-phase data-dividing clocks and a phase of the first system clock and generating the first phase detection signal; and
comparing the phase of the select clock selected among the plurality of multi-phase data-dividing clocks and a phase of the second system clock and generating the second phase detection signal.

21. The method of claim 20, wherein the selecting any one of the data clock and a clock acquired by delaying the data clock by the self correction time comprises:
selecting and outputting the data clock when the first and second phase detection signals have the same logic level; and
selecting and outputting the clock acquired by delaying the data clock by the self correction time when the first and second phase detection signals have opposite logic levels.

22. The method of claim 21, wherein the determining of the logic level of the reverse control signal comprises:
controlling the logic level of the reverse control signal to have a first logic level such that the phase of the data clock is not reversed when the first phase detection signal has the first logic level after the selecting any one of the data clock and a clock acquired by delaying the data clock by the self correction time is implemented; and
controlling the logic level of the reverse control signal to have a second logic level such that the data clock is inputted by being reversed in the phase in response to that the first phase detection signal has the second logic level after the selecting any one of the data clock and a clock acquired by delaying the data clock by the self correction time is implemented.

23. The method of claim 19, further comprising:
delaying a latency by delaying the first system clock by the delay amount;
counting a phase difference between a clock outputted through the delaying of the latency and the clock outputted through the selecting, by the period of the clock outputted through the selecting; and
setting a value of a write latency and a value of a column latency according to a result of the counting.

24. The method of claim 20, wherein the select clock is a multi-phase data-dividing clock including a phase that is not the same as and is not opposite to the data-dividing clock, among the plurality of multi-phase data-dividing clocks.

* * * * *